United States Patent
Foote (12)

(10) Patent No.: US 7,053,464 B1
(45) Date of Patent: May 30, 2006

(54) SYSTEM AND METHOD FOR PROVIDING A VARIABLE BREAKDOWN BIPOLAR TRANSISTOR

(75) Inventor: Richard W. Foote, Kennedale, TX (US)

(73) Assignee: National Semiconductor Corporation, Santa Clara, CA (US)

( * ) Notice: Subject to any disclaimer, the term of this patent is extended or adjusted under 35 U.S.C. 154(b) by 37 days.

(21) Appl. No.: 10/801,739

(22) Filed: Mar. 16, 2004

(51) Int. Cl.
*H01L 27/082* (2006.01)

(52) U.S. Cl. .......................... 257/565; 437/31; 437/33; 437/26; 437/27; 437/59; 437/76

(58) Field of Classification Search ................. 437/31, 437/33, 26, 27, 59, 76
See application file for complete search history.

(56) References Cited

U.S. PATENT DOCUMENTS 5,648,281 A * 7/1997 Williams et al. ............ 438/358

* cited by examiner

*Primary Examiner*—Mai-Huong Tran

(57) ABSTRACT

A system and method is disclosed for providing a variable breakdown bipolar transistor. A trench is etched in a substrate between a first area (base/emitter area) and a second area (sinker/collector area). The sinker/collector contact area and a portion of the bottom of the trench adjacent to the sinker/collector area are then heavily doped. The lateral distance between the base/emitter area and the edge of the heavily doped trench determines the breakdown voltage between the emitter and collector and between the base and collector. Heat treatment diffuses the dopant in the bottom of the trench laterally and diffuses the dopant in the sinker/collector area downward until the two areas are joined to form a unified sinker/collector structure.

21 Claims, 7 Drawing Sheets

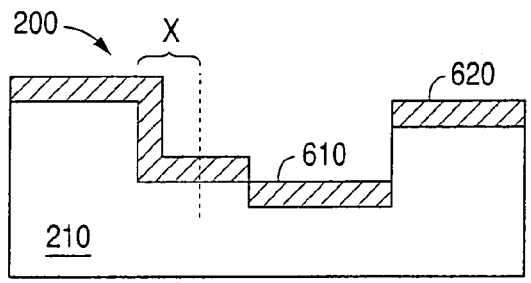
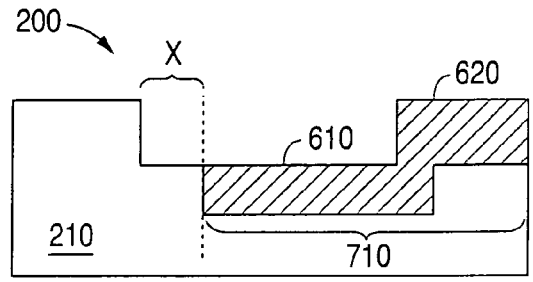
FIG. 6   FIG. 7
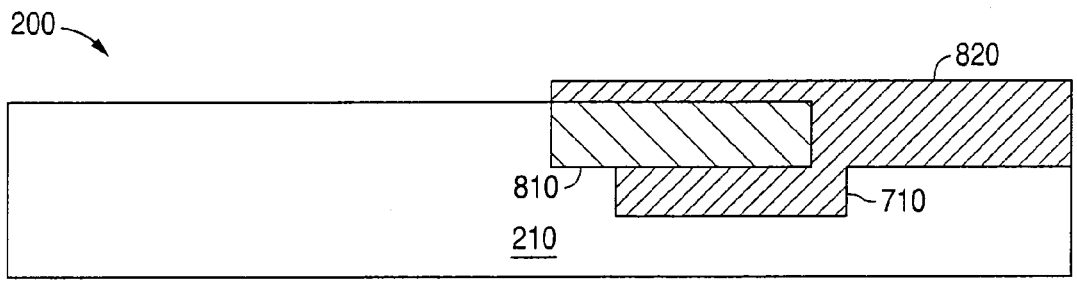
FIG. 8
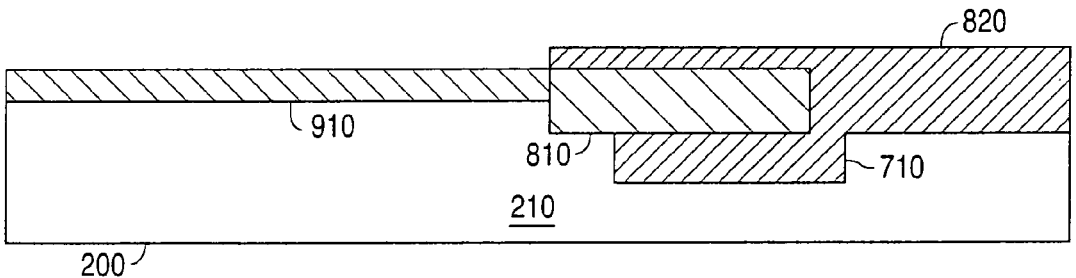
FIG. 9
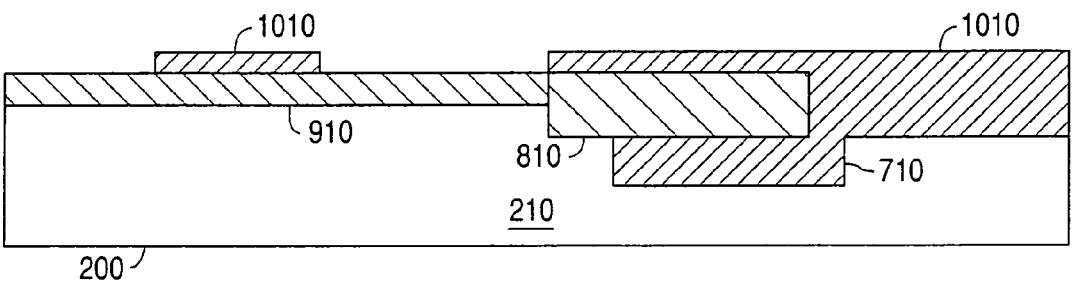
FIG. 10

SYSTEM AND METHOD FOR PROVIDING A VARIABLE BREAKDOWN BIPOLAR TRANSISTOR

TECHNICAL FIELD OF THE INVENTION

The present invention is generally directed to manufacturing technology for semiconductor devices and, in particular, to a system and method for providing a variable breakdown bipolar transistor.

BACKGROUND OF THE INVENTION

Prior art bipolar transistors typically comprise a heavily doped buried layer that is located under a lightly doped epitaxial layer (epi layer). The epi layer provides high breakdown and the buried layer provides low resistance. A heavily doped sinker is often used to provide a low resistance path between the buried layer and an external collector contact.

Breakdown voltage is directly proportional to the thickness of the epi layer. Therefore all vertical bipolar transistors that have the same epi layer thickness will have the same breakdown voltage. Breakdown voltage generally has an inverse relationship to operating speed and series resistance.

There are some circuit applications in which it would be desirable to have some bipolar transistors that have a first value of breakdown voltage and some other bipolar transistors (in the same integrated circuit) that have a second (different) value of breakdown voltage. In this way, those transistors with lower breakdown voltage requirements could have faster speeds and lower series resistance. Prior art bipolar transistors are not capable of having more than one value of breakdown voltage.

Therefore, there is a need in the art for a system and method for manufacturing a bipolar transistor that is capable of having more than one value of breakdown voltage. That is, there is a need in the art for a system and method for manufacturing a bipolar transistor that is capable of having one of a plurality of possible breakdown voltages.

SUMMARY OF THE INVENTION

To address the above-discussed deficiencies of the prior art, it is a primary object of the present invention to provide a system and method for providing a variable breakdown bipolar transistor.

In one advantageous embodiment of the present invention a bipolar transistor is constructed in the following manner. A first trench mask is placed over a first area of a substrate layer in which a base and an emitter will be formed and a second trench mask is placed over a second area of the substrate layer in which a sinker and a collector will be formed. An etch process is then applied to etch a trench in the substrate layer between the first and second areas. The trench masks are then removed.

A collector and sinker mask is then placed over a portion of the bottom of the trench that is adjacent to the first area and over the first area of the substrate where the base and emitted will be located. The lateral spacing of a horizontal portion of the collector and sinker mask is selected to control the distance of a subsequent lateral diffusion of the collector from the base/emitter area. Then an implant doping procedure is performed to dope a sinker portion and a collector portion of the substrate layer. The collector and sinker mask is then removed.

Then a heat treatment is applied to diffuse the dopant in the sinker portion and to diffuse the dopant in the collector portion. The diffusion of dopant joins the sinker portion and the collector portion to form a sinker and collector layer. The heat treatment also causes dopant in the collector portion to laterally diffuse under the sinker. This is a more efficient method of joining the lateral low resistance path with the vertical low resistance path than the prior art method of driving a sinker down from the top of the wafer to meet the buried layer. The heat treatment is terminated when the lateral diffusion of dopant reaches a desired distance from the wall of the trench that is adjacent to the first area. The distance of the collector layer from the base/emitter area determines the value of breakdown voltage for the bipolar transistor.

The trench is then filled with dielectric material. Conventional manufacturing steps are then performed to form a base and an emitter in the first area and a collector in the second area. Those skilled in the art will recognize that there are multiple methods available to form the base and the emitter, including but not limited to, direct doping and drive, single poly emitter, double poly for extrinsic base and emitter, epitaxial base or SiGe or SiGe base processes. The present invention is compatible with any of these methods. In the present example, only the most basic method of forming the base and emitter is illustrated.

A bipolar transistor constructed in this manner will have a value of breakdown voltage that is proportional to the distance that is set between the bottom of the base diffusion and the side of the laterally diffusing heavily doped collector. This spacing can be optimized with both vertical and lateral spacing. The spacing can be optimized vertically with the depth of the trench and the depth of the base diffusion. The spacing can be optimized laterally with the width of the trench and the lateral diffusion of the heavily doped layer. Those persons who are skilled in the art will recognize that there are cost, spacing and parametric considerations which would contribute to the choice of variables for a given breakdown requirement.

It is an object of the present invention to provide a system and method for manufacturing a bipolar transistor that may have one of a plurality of possible breakdown voltages.

It is also an object of the present invention to provide a system and method for manufacturing a bipolar transistor that comprises a variable length collector portion of a sinker and collector layer.

It is yet another object of the present invention to provide a system and method for utilizing lateral diffusion of dopant in a collector portion to adjust the length of the collector portion to a desired distance from the base and emitter.

It is still another object of the present invention to provide a system and method for constructing a bipolar transistor that has a value of breakdown voltage that is proportional to a distance that is chosen for a collector portion of a sinker and collector layer of the bipolar transistor to the base and emitter portion of the bipolar transistor.

It is still another object of the present invention to provide a system and method for more efficiently joining a low resistance lateral collector component and a low resistance vertical collector component (sinker) of a bipolar transistor.

The foregoing has outlined rather broadly the features and technical advantages of the present invention so that those skilled in the art may better understand the detailed description of the invention that follows. Additional features and advantages of the invention will be described hereinafter that form the subject of the claims of the invention. Those skilled in the art should appreciate that they may readily use the conception and the specific embodiment disclosed as a basis for modifying or designing other structures for carrying out the same purposes of the present invention. Those skilled in the art should also realize that such equivalent constructions do not depart from the spirit and scope of the invention in its broadest form.

Before undertaking the Detailed Description of the Invention below, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, such a device may be implemented in hardware, firmware or software, or some combination of at least two of the same. It should be noted that the functionality associated with any particular controller may be centralized or distributed, whether locally or remotely. Definitions for certain words and phrases are provided throughout this patent document, those of ordinary skill in the art should understand that in many, if not most instances, such definitions apply to prior uses, as well as future uses, of such defined words and phrases.

BRIEF DESCRIPTION OF THE DRAWINGS

For a more complete understanding of the present invention and its advantages, reference is now made to the following description taken in conjunction with the accompanying drawings, in which like reference numerals represent like parts:

FIGS. 2 through 20 illustrate successive stages in the construction of a variable breakdown bipolar transistor in accordance with the principles of the present invention;

DETAILED DESCRIPTION OF THE INVENTION

FIGS. 1 through 22, discussed below, and the various embodiments used to describe the principles of the present invention in this patent document are by way of illustration only and should not be construed in any way to limit the scope of the invention. Those skilled in the art will understand that the principles of the present invention may be implemented in any type of suitably arranged bipolar transistor device.

Figure 1:
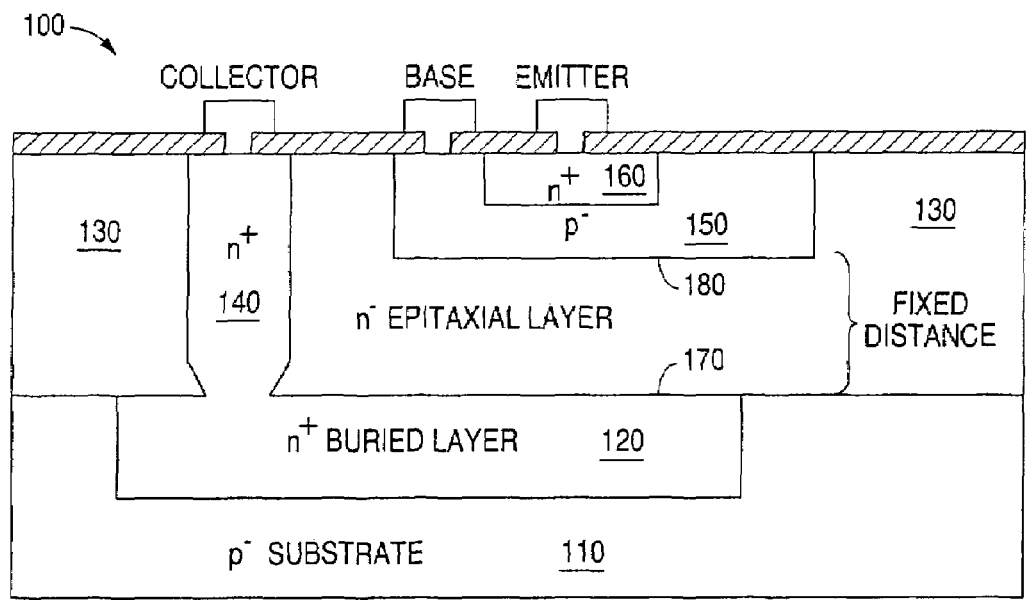
FIG. 1 illustrates a typical structure of a prior art bipolar transistor that has a fixed distance between an upper surface of a buried layer and a lower surface of the base of the bipolar transistor.

FIG. 1 illustrates a typical prior art bipolar transistor 100. Bipolar transistor 100 comprises a p⁻ substrate 110 in which an n⁺ buried layer 120 is embedded. An n⁻ epitaxial layer 130 is placed over n⁺ buried layer 120 and p⁻ substrate 110. Sinker 140 connects n⁺ buried layer 120 to an external collector contact. Base 150 is made of a p⁻ layer of material. Emitter 160 is made of an n⁺ layer of material.

The thickness of n⁻ epitaxial layer 130 between n⁺ buried layer 120 and base 150 in bipolar transistor 100 is fixed. Specifically, the distance from the upper surface 170 of n⁺ buried layer 120 to the lower surface 180 of base 150 is a fixed distance. This means that all of the devices that have this structure have a fixed value of breakdown voltage. That is, the value of the breakdown voltage for bipolar transistor 100 is not variable.

Figure 2:
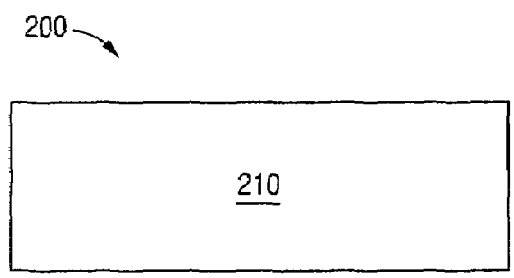
Figure 3:
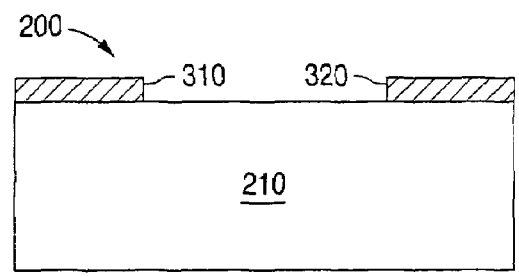

FIG. 2 illustrates a first stage in the construction of a variable breakdown bipolar transistor 200 constructed in accordance with the principles of the present invention. The construction of bipolar transistor 200 begins by providing substrate layer 210. As shown in FIG. 3, a trench mask (comprising portions 310 and 320) is placed over substrate layer 210 and a central portion of substrate layer 210 remains exposed.

Figure 4:
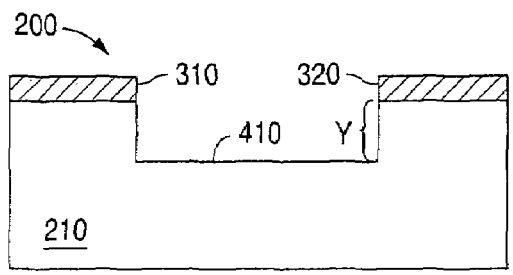

An etch procedure is then performed to form trench 410 in substrate layer 210. The result of the etch procedure is shown in FIG. 4. The depth of trench 410 is designated by the letter Y. The value of the depth Y is chosen to optimize the value of resistance of bipolar transistor 200 versus breakdown voltage as well as to optimize the use of space for the transistor. Because the trenches for all transistors will be etched at the same time, this vertical component of the breakdown will be a constant for all transistors. The width of the trench can be varied for each transistor so this component of breakdown provides the variable nature of the invention.

To simplify the drawings the reference numerals from previous drawings will sometimes not be repeated for structures that have already been identified.

Figure 5:
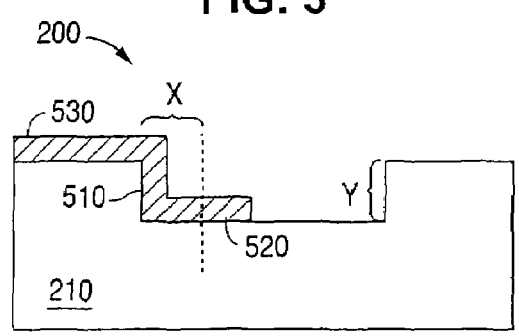

The trench mask (310, 320) is then removed from substrate layer 210. Then a collector and sinker mask (comprising a vertical portion 510 and horizontal portions 520 and 530) is placed over a portion of substrate layer 210 as shown in FIG. 5. The vertical portion 510 of the collector and sinker mask covers the left wall of trench 410 where the base and emitter will be located. The horizontal portion 520 of the collector and sinker mask covers a portion of the bottom of trench 410. The horizontal portion 530 of the collector and sinker mask covers a portion of the substrate 210 where the base and emitter will be located.

The lateral extent of horizontal portion 520 of the collector and sinker mask is selected so that the subsequent lateral diffusion of the sinker will not extend into the portion of substrate layer 210 that is located within a distance X from the left wall of trench 410. The value of the distance X is chosen to optimize the value of resistance of bipolar transistor 200 versus breakdown voltage.

An implant doping procedure is then performed to dope the collector and sinker areas of substrate layer 210. The collector and sinker mask (including vertical portion 510 and horizontal portions 520 and 530) shields the underlying portions of substrate layer 210 from the implant doping procedure. The result of applying the implant doping procedure is shown in FIG. 6. The doped portion of the bottom of trench 410 is designated with reference numeral 610 (collector portion 610). The doped portion of the top right hand portion of substrate layer 210 is designated with reference numeral 620 (sinker portion 620).

Then the collector and sinker mask (including vertical portion 510 and horizontal portions 520 and 530) is removed. Heat treatment is applied to diffuse the dopant in collector portion 610 and the dopant in sinker portion 620 into the underlying portions of substrate layer 210. The result of the diffusion process is shown in FIG. 7.

The dopant in collector portion 610 diffuses downwardly and laterally into substrate layer 210. The dopant in sinker portion 620 diffuses downwardly into substrate layer 210. The downward diffusion of dopant in collector portion 610 causes the thickness of doped collector portion 610 to increase. Similarly, the downward diffusion of dopant in sinker portion 620 causes the thickness of sinker portion 620 to increase. The lateral diffusion of dopant in collector portion 610 causes the left boundary of doped collector portion 610 to extend to the boundary that is located at a distance X from the left wall of trench 410. The heat treatment is terminated when the diffusion of the dopant in collector portion 610 reaches the boundary. The lateral diffusion of dopant in collector portion 610 causes the right boundary of doped collector portion 610 to extend past the right wall of trench 410 and contact the downwardly diffused doped sinker portion 620.

Key considerations for the trench depth and width are (1) that when the diffusion of the vertical component of the sinker is complete, the vertical component of the sinker has met the lateral collector component as the lateral collector component diffuses to the right, and (2) the lateral diffusion of the lateral collector component to the left has not entered the base/collector depletion region.

The collector portion 610 and the collector portion 620 combine and form a unitary structure that comprises a sinker and collector layer 710. The sinker and collector layer 710 of the present invention comprises a collector portion 610 in which the distance of the collector portion 610 from the base/emitter area may be selected. That is, the lateral dimension (spacing) of collector portion 610 is variable. The variable spacing of collector portion 610 enables a manufacturer to select a particular value of breakdown voltage for bipolar transistor 200 by selecting an appropriate spacing of the collector portion 610 to the base/emitter area.

The next steps in the construction of bipolar transistor 200 are shown in FIG. 8. Trench 410 is filled with a dielectric material 810 and planarized. Then an intrinsic base mask 820 is placed over the dielectric material 810 and the collector portion 620 of sinker and collector layer 710.

An implant doping procedure is then performed to dope the uncovered portion of substrate layer 210 to form an intrinsic base. The intrinsic base mask 820 shields the dielectric material 810 and the sinker portion 620 of sinker and collector layer 710 from the implant doping procedure for the intrinsic base. The result of applying the implant doping procedure is shown in FIG. 9. The doped portion of substrate layer 210 is designated with reference numeral 910.

The doped substrate layer 910 is doped to form a material that is opposite in polarity to substrate layer 210 and sinker and collector layer 710. That is, if substrate layer 210 and sinker and collector layer 710 are p type material, then doped substrate layer 910 is n type material, and vice versa.

Figure 11:
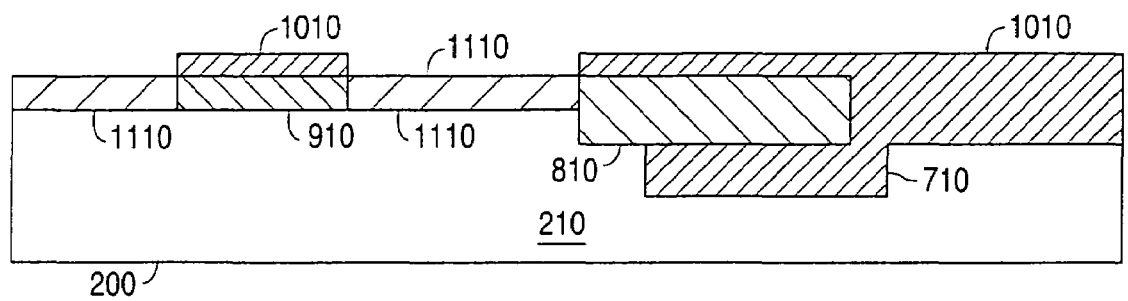

The intrinsic base mask 820 is then removed. Then an extrinsic base mask 1010 is placed over the doped substrate layer 910 and over the dielectric trench fill material 810 and sinker portion 620 of the sinker and collector layer 710. The result of this step is shown in FIG. 10. An implant doping procedure is then performed to dope the uncovered portion of doped substrate layer 910 to form an extrinsic base. The extrinsic base mask 1010 shields the dielectric material 810 and the sinker portion 620 of sinker and collector layer 710 from the implant doping procedure for the extrinsic base. The extrinsic base mask 1010 also shields a central portion of doped substrate layer 910 from the implant doping procedure for the extrinsic base. The result of applying the implant doping procedure is shown in FIG. 11. The unshielded portions of doped substrate layer 910 are heavily doped to form extrinsic base portions 1110.

Figure 12:
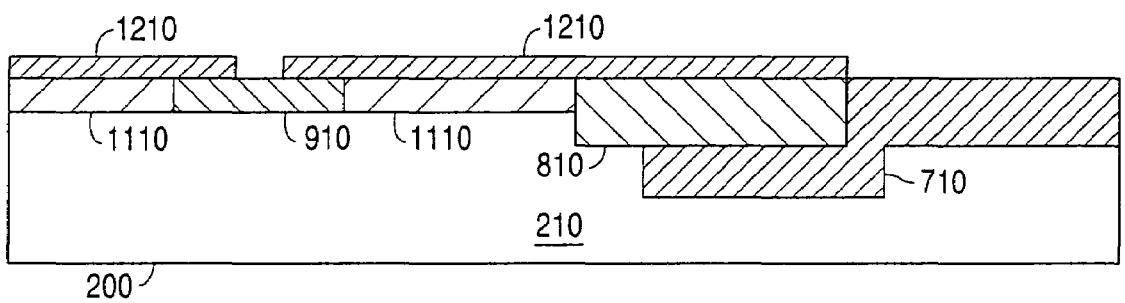

Then extrinsic base mask 1010 is removed. An emitter mask 1210 is then placed over the dielectric material 810, and over the extrinsic base portions 1110, and over edge portions of doped substrate layer 910. A central portion of doped substrate layer 910 is left exposed as shown in FIG. 12.

Figure 13:
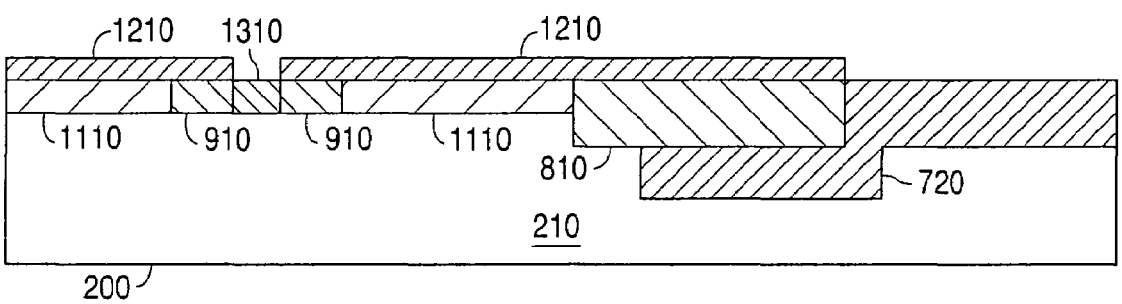

An implant doping procedure is then performed to dope the uncovered portion of doped substrate layer 910 to form emitter 1310. The emitter mask 1210 shields the dielectric material 810, and the extrinsic base portions 1110, and the edge portions of doped substrate layer 910 from the implant doping procedure for the emitter. The result of applying the implant doping procedure is shown in FIG. 13.

The central unshielded portions of doped substrate layer 910 are heavily doped to form emitter 1310. Emitter 1310 is formed having a polarity that that is the same polarity as substrate layer 210 and sinker and collector layer 710. That is, if substrate layer 210 and sinker and collector layer 710 are p type material, then emitter 1310 is p type material, and vice versa.

Figure 14:
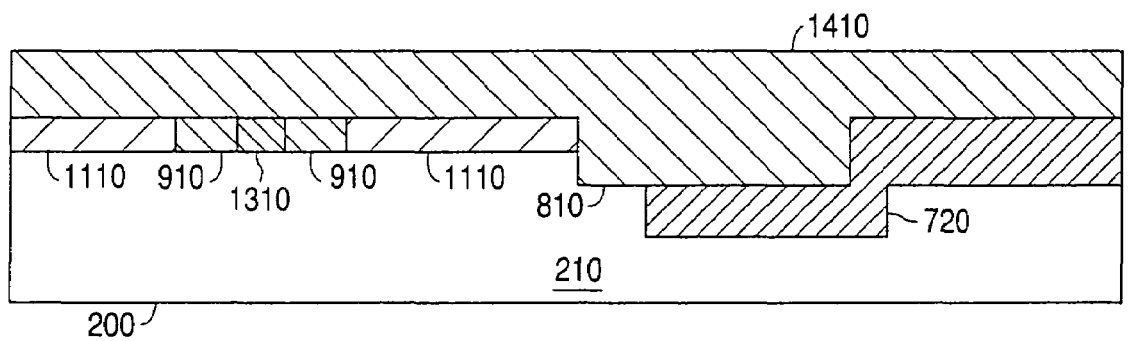

Then the emitter mask 1210 is removed and dielectric material 1410 is placed over the surface of bipolar transistor 200. The result of the deposition of dielectric material 1410 is shown in FIG. 14. Dielectric material 810 and dielectric material 1410 are in contact with each other.

Figure 15:
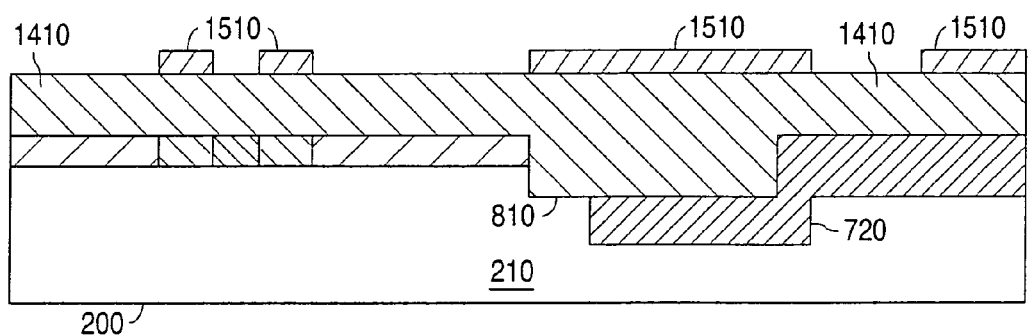
Figure 16:
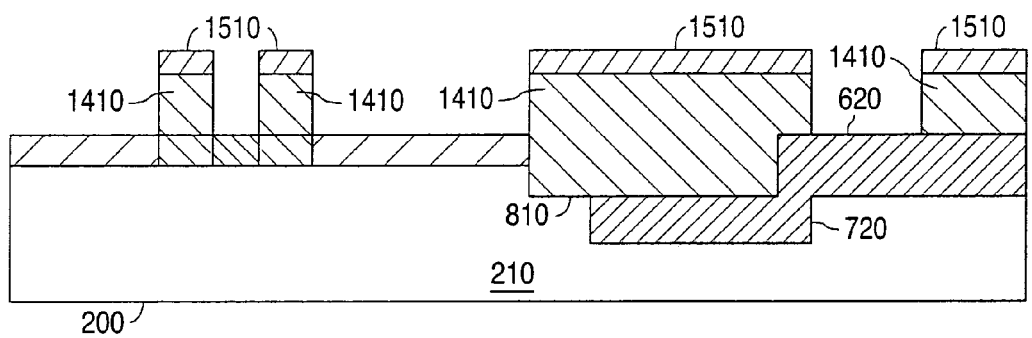

Then a contact mask 1510 is placed over the dielectric material 1410 as shown in FIG. 15. An etch procedure is then performed to etch the uncovered portion of dielectric material 1410 down to the extrinsic base portions 1110, and down to the emitter 1310, and down to the collector portion 620 of sinker and collector layer 710. The result of the etch procedure is shown in FIG. 16.

Figure 17:
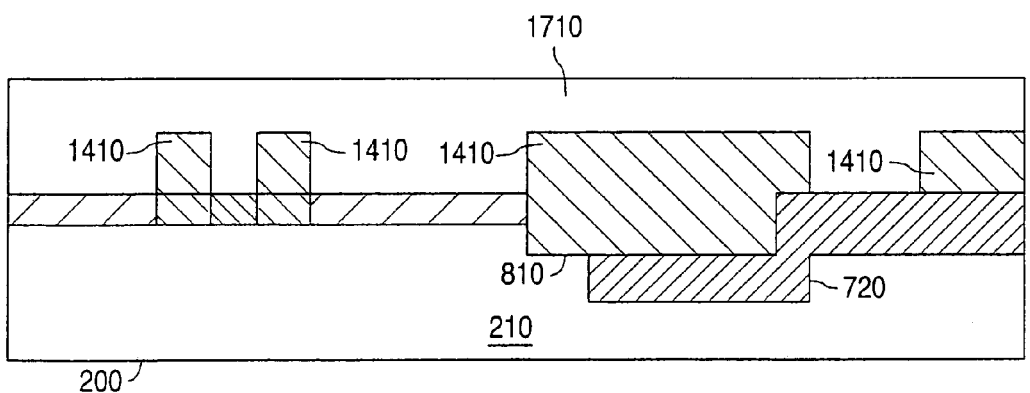

Then the contact mask 1510 is removed and metal 1710 is placed over the surface of bipolar transistor 200. The result of the deposition of metal 1710 is shown in FIG. 17. Metal 1710 is in contact with the extrinsic base portions 1110, and with the emitter 1310, and with the collector portion 620 of sinker and collector layer 710.

Figure 18:
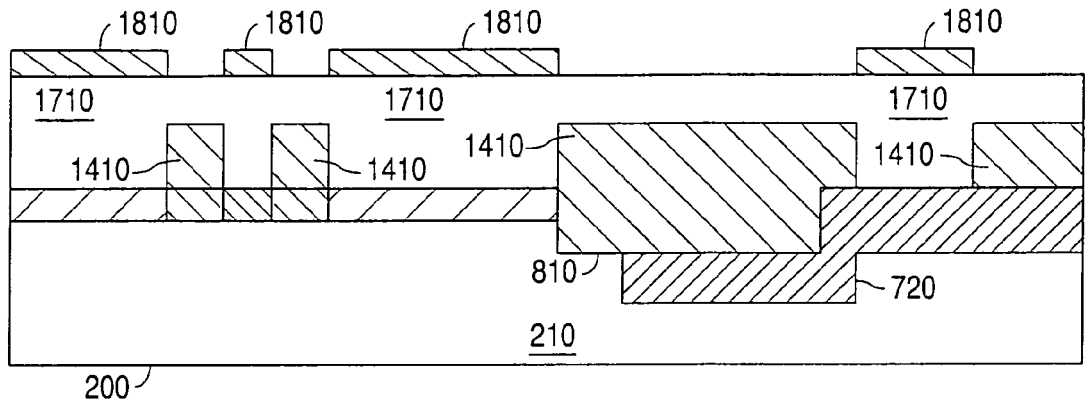
Figure 19:
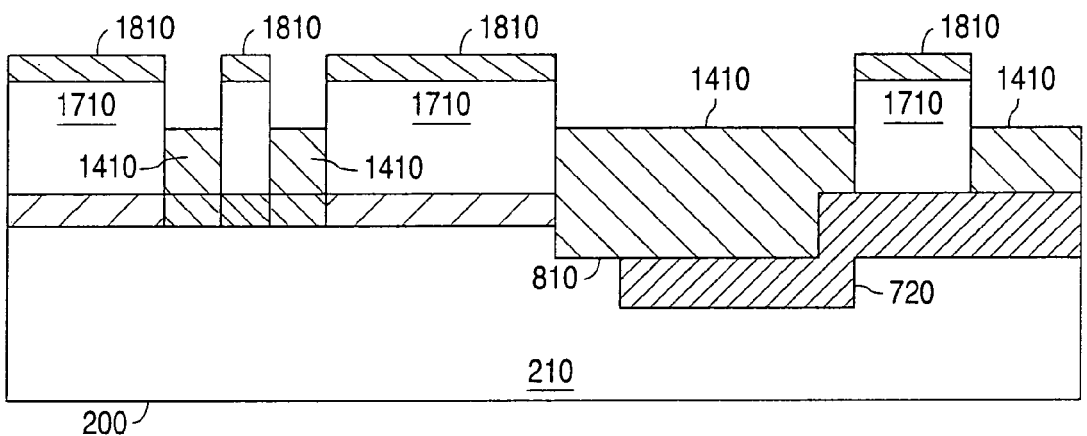
Figure 20:
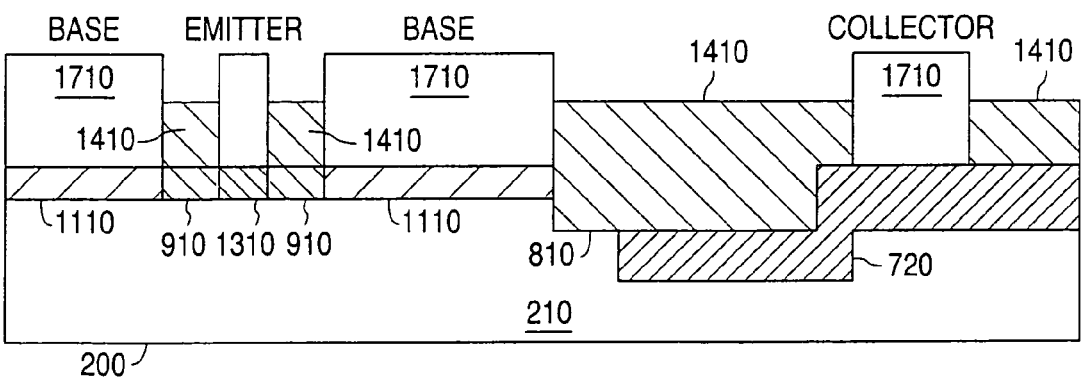

Then a metal mask 1810 is placed over metal layer 1710 as shown in FIG. 18. A metal etch procedure is then performed to etch the uncovered portion of metal 1710 down to the portions of dielectric material 1410. The result of the metal etch procedure is shown in FIG. 19. After the metal etch procedure is completed, the metal mask 1810 is removed. Bipolar transistor 200 then has the structure shown in FIG. 20.

Figure 21:
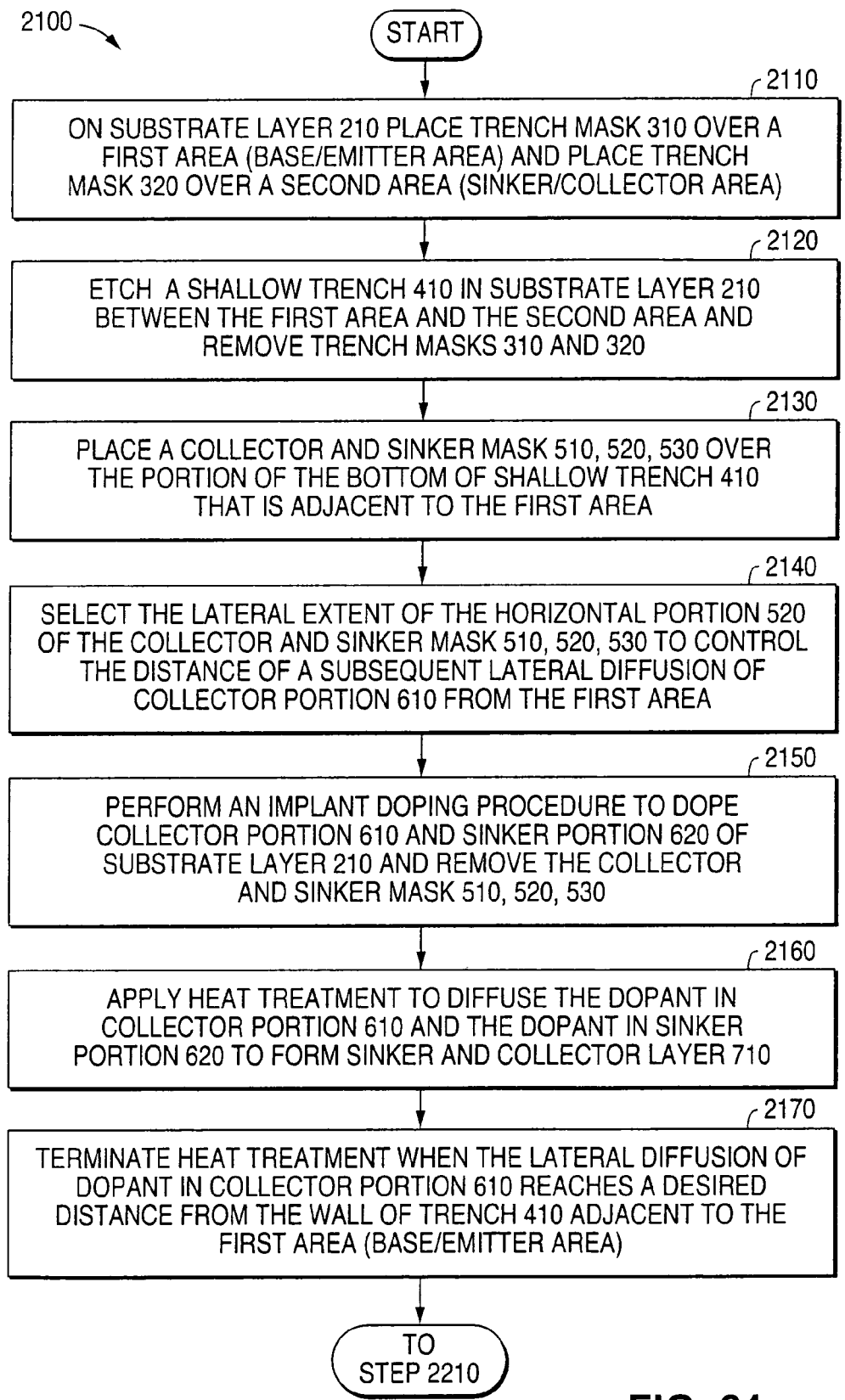
FIG. 21 illustrates a flow chart showing the steps of a first portion of an advantageous embodiment of the method of the present invention.

FIG. 21 illustrates a flow chart 2100 showing the steps of a first portion of an advantageous embodiment of the method of the present invention. The manufacture of bipolar transistor 200 of the present invention begins by providing a substrate layer 210. A trench mask 310 is placed over a first area where the base and the emitter will be formed (base/emitter area) and a trench mask 320 is placed over a second area where the sinker and the collector will be formed (sinker/collector area) (step 2110). Then a shallow trench 410 is etched in substrate layer 210 between the first area and the second area and the trench masks 310 and 320 are removed (step 2120).

Then a collector and sinker mask (510, 520, 530) is placed over the portion of the bottom of shallow trench 410 that is located adjacent to the first area (step 2130). The lateral extent of the horizontal portion 520 of the collector and sinker mask (510, 520, 530) is selected to control the distance of a subsequent lateral diffusion of the collector from the base/emitter area (step 2140). An implant doping procedure is then performed to dope the collector portion 610 and the sinker portion 620 of substrate layer 210 and the collector and sinker mask (510, 520, 530) is removed (step 2150).

A heat treatment is then applied to diffuse the dopant in collector portion 610 and the dopant in sinker portion 620 to form sinker and collector layer 710 (step 2160). The heat treatment is terminated when the lateral diffusion of the dopant in sinker portion 610 reaches a desired distance from the wall of trench 410 that is adjacent to the first area (base/emitter area) (step 2170). Control then passes to step 2210 of FIG. 22.

Figure 22:
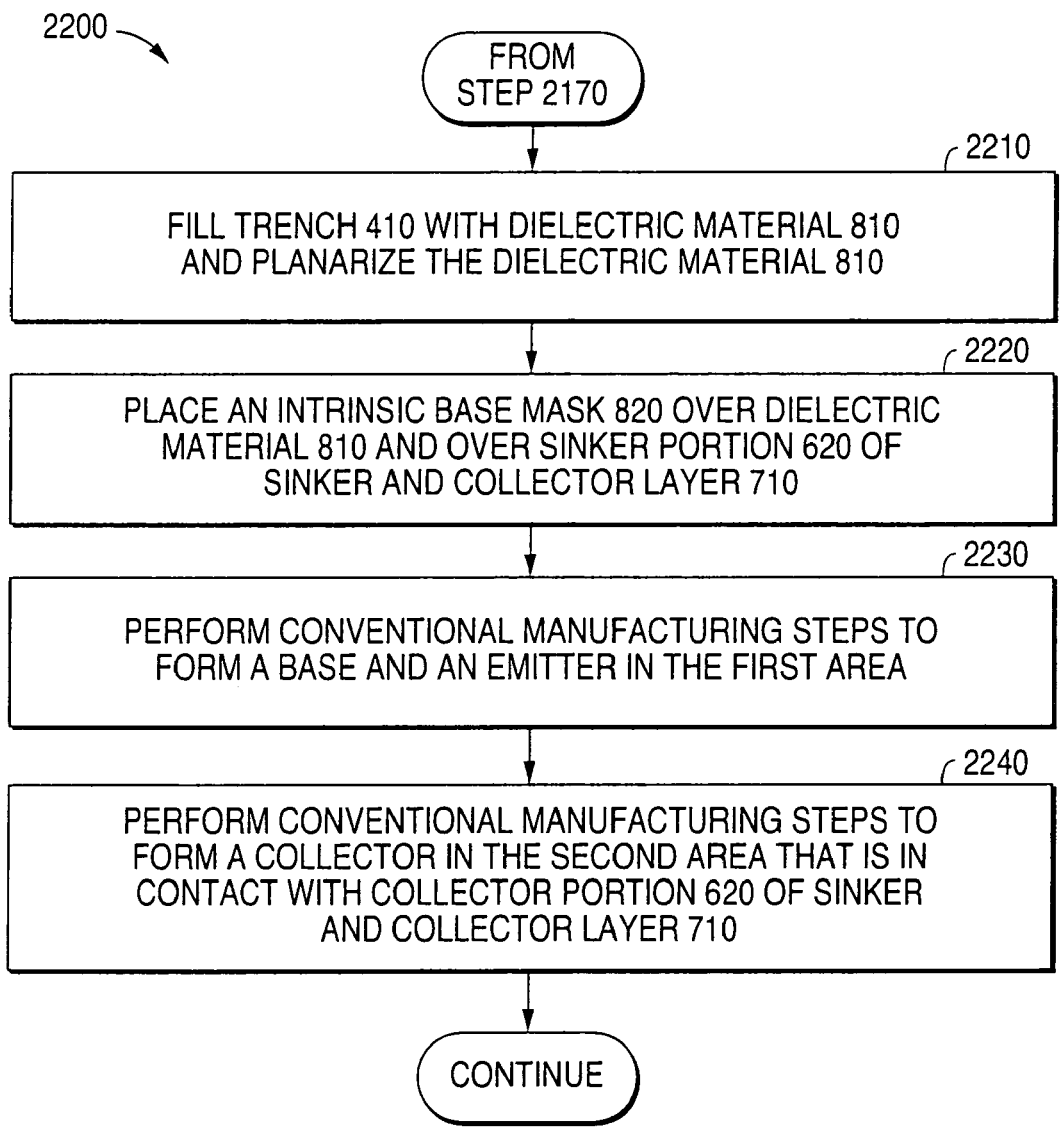
FIG. 22 illustrates a flow chart showing the steps of a second portion of an advantageous embodiment of the method of the present invention.

FIG. 22 illustrates a flow chart 2200 showing the steps of a second portion of an advantageous embodiment of the method of the present invention. Control passes to step 2210 from step 2170 of FIG. 21. Trench 410 is then filled with dielectric material 810 and the dielectric material is planarized (step 2210). Then an intrinsic base mask 820 is placed over the dielectric material 810 and over the sinker portion 620 of the sinker and collector layer 710 (step 2220). Then conventional manufacturing steps are performed to form a base and an emitter in the first area (step 2230). Then additional conventional manufacturing steps are performed to form a collector in the second area where the collector is in contact with the sinker portion 620 of the sinker and collector layer 710 (step 2340). These steps form the variable breakdown bipolar transistor 200 of the present invention.

An exemplary embodiment of the present invention has been described for an NPN bipolar transistor. Those persons who are skilled in the art will recognize that the present invention may also be used in a PNP bipolar transistor.

An exemplary embodiment of the present invention has been described in which an implant method has been used to dope the silicon. Those persons who are skilled in the art will recognize that other methods are available, including but not limited to, diffusion from a doped glass source, $POCl_3$, $BBr_3$, $BCl_3$, $PH_3$, furnace processing adjacent to a doped ceramic source, and other similar methods. Those persons who are skilled in the art will also recognize that these other doping methods require a masking layer capable of withstanding the doping temperature, most often a silicon dioxide, and a mask and etch step prior to the doping to remove the masking layer from the areas of silicon to be doped.

Although the present invention has been described with an exemplary embodiment, various changes and modifications may be suggested to one skilled in the art. It is intended that the present invention encompass such changes and modifications as fall within the scope of the appended claims.

What is claimed is:

1. A method for manufacturing a bipolar transistor, comprising the steps of:
    etching a trench in a substrate between a first area for forming a base and an emitter and a second area for forming a sinker and a collector;
    doping a portion of said substrate in said second area to form a sinker and collector layer comprising a sinker portion and a collector portion; and
    establishing a value of breakdown voltage for said bipolar transistor by causing a distance of said collector portion from said first area to have a selected value.

2. The method as set forth in claim 1 wherein said step of doping a portion of said substrate to form a sinker and collector layer comprising a sinker portion and a collector portion comprises the steps of:
    implanting dopant in a portion of said substrate at a bottom of said trench to create said collector portion of said sinker and collector layer; and
    implanting dopant in a portion of said substrate that is located adjacent to said collector portion but not in said trench to create said sinker portion of said sinker and collector layer.

3. The method as set forth in claim 2 further comprising the step of:
    applying a heat treatment to diffuse the dopant in said sinker portion into adjacent substrate areas and to diffuse the dopant in said collector portion into adjacent substrate areas until said sinker portion and said collector portion are joined to form said sinker and collector layer.

4. The method as set forth in claim 3 further comprising the step of:
    terminating said heat treatment when said dopant in said collector portion diffuses laterally under said trench to a desired distance from said first area.

5. The method as set forth in claim 1 further comprising the step of:
    etching said trench to a depth that optimizes a value of resistance of said bipolar transistor versus breakdown voltage of said bipolar transistor.

6. The method as set forth in claim 1 wherein said step of establishing a value of breakdown voltage for said bipolar transistor by causing a distance of said collector portion from said first area to have a selected value comprises the steps of:
    placing a collector and sinker mask over a portion of said trench that is adjacent to said first area; and
    selecting a lateral extent of a horizontal portion of said collector and sinker mask to control a distance of a subsequent lateral diffusion of said collector portion from said first area.

7. The method as set forth in claim 6 wherein said lateral extent of said horizontal portion of said collector and sinker mask is selected so that the subsequent lateral diffusion of said collector portion does not extend into a portion of said substrate layer that is located within a specified distance from a wall of said trench that is adjacent to said first area.

8. The method as set forth in claim 7 wherein said specified distance is a distance that optimizes a value of resistance of said bipolar transistor versus breakdown voltage of said bipolar transistor.

9. A bipolar transistor, comprising:
    a trench etched in a substrate between a first area for forming a base and an emitter and a second area for forming a sinker and a collector; and
    a portion of said substrate in said second area doped to form a sinker and collector layer comprising a sinker portion and a collector portion;
    wherein said collector portion is formed having a selected distance from said first area to establish a selected value of breakdown voltage for said bipolar transistor.

10. The bipolar transistor as set forth in claim 9 wherein said sinker and collector layer comprises:
    a portion of said substrate at a bottom of said trench that is doped to create said collector portion of said sinker and collector layer; and
    a portion of said substrate that is located adjacent to said collector portion but not in said trench that is doped to create said sinker portion of said sinker and collector layer.

11. The bipolar transistor as set forth in claim 10 further comprising:
   said sinker portion having dopant diffused into adjacent substrate areas and said collector portion having dopant diffused into adjacent substrate areas wherein said diffused dopant joins said sinker portion and said collector portion to form said sinker and collector layer.

12. The bipolar transistor as set forth in claim 11 wherein:
   the dopant of the collector portion has diffused laterally under said trench to a desired distance from said first area.

13. The bipolar transistor as set forth in claim 9 wherein said trench is etched to a depth that optimizes a value of resistance of said bipolar transistor versus breakdown voltage of said bipolar transistor.

14. The bipolar transistor as set forth in claim 9 wherein said selected distance is determined by:
   placing a collector and sinker mask over a portion of said trench that is adjacent to said first area; and
   selecting a lateral spacing of a horizontal portion of said collector and sinker mask from said first area to control a length of a subsequent lateral diffusion of said collector portion.

15. The bipolar transistor as set forth in claim 14 wherein said lateral spacing of said horizontal portion of said collector and sinker mask is selected so that the subsequent lateral diffusion of said collector portion does not extend into a portion of said substrate layer that is located within a specified distance from a wall of said trench that is adjacent to said first area.

16. The bipolar transistor as set forth in claim 15 wherein said specified distance is a distance that optimizes a value of resistance of said bipolar transistor versus breakdown voltage of said bipolar transistor.

17. A bipolar transistor, comprising:
   a trench etched in a substrate between a first area for forming a base and an emitter and a second area for forming a sinker and a collector; and
   a sinker and collector layer comprising a sinker portion and a collector portion formed by doping a portion of said substrate;
   wherein a value of breakdown voltage for said bipolar transistor is determined by a distance of said collector portion from said first area.

18. The bipolar transistor as set forth in claim 17 wherein lateral diffusion of dopant in said collector portion determines said distance of said collector portion from said first area.

19. The bipolar transistor set forth in claim 18 wherein said dopant in said collector portion at a bottom of said trench is laterally diffused under said trench by heat treatment.

20. The bipolar transistor as set forth in claim 18 wherein a distance of said collector portion before dopant in said collector portion laterally diffuses is determined by a length of a horizontal portion of a collector and sinker mask.

21. The method as set forth in claim 1, wherein the sinker portion is located adjacent to the trench and the collector portion is located at least partially under the trench.

\* \* \* \* \*